United States Patent
Hilde et al.

(10) Patent No.: US 12,170,107 B2
(45) Date of Patent: Dec. 17, 2024

(54) SELF-REFRESH STATE WITH DECREASED POWER CONSUMPTION

(71) Applicant: Micron Technology, Inc., Boise, ID (US)

(72) Inventors: Shawn M. Hilde, Meridian, ID (US); Dennis G. Montierth, Meridian, ID (US); Garth N. Grubb, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 17/808,818

(22) Filed: Jun. 24, 2022

(65) Prior Publication Data
US 2023/0420023 A1 Dec. 28, 2023

(51) Int. Cl.
*G11C 11/406* (2006.01)
(52) U.S. Cl.
CPC ............... *G11C 11/40615* (2013.01)
(58) Field of Classification Search
CPC ...... G11C 11/40615; G11C 2211/4061; G11C 2211/4067
USPC .......................................... 365/222
See application file for complete search history.

(56) References Cited

U.S. PATENT DOCUMENTS

| 2004/0196718 A1* | 10/2004 | Poechmueller | G11C 11/406 365/236 |
| 2009/0187689 A1* | 7/2009 | Roohparvar | G11C 11/40615 711/170 |

* cited by examiner

*Primary Examiner* — Huan Hoang
(74) *Attorney, Agent, or Firm* — Holland & Hart LLP

(57) ABSTRACT

Methods, systems, and devices for a self-refresh state with decreased power consumption are described. A memory system may enter a self-refresh state to refresh a set of rows of memory cells at the memory system. Based on entering the self-refresh state, the memory system may execute a first set of refresh operations on the rows of memory cells according to a first rate. Additionally, the memory system may determine, while in the self-refresh state, whether to decrease the rate for executing the refresh operations to a second rate based on whether each of the rows of memory cells is refreshed according to the first rate. In cases that the memory system determines to decrease the rate for executing the refresh operations, the memory system may execute a set of second refresh operations on the rows of memory cells according to the second, slower, rate while in the self-refresh state.

20 Claims, 6 Drawing Sheets

SELF-REFRESH STATE WITH DECREASED POWER CONSUMPTION

FIELD OF TECHNOLOGY

The following relates to one or more systems for memory, including a self-refresh state with decreased power consumption.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
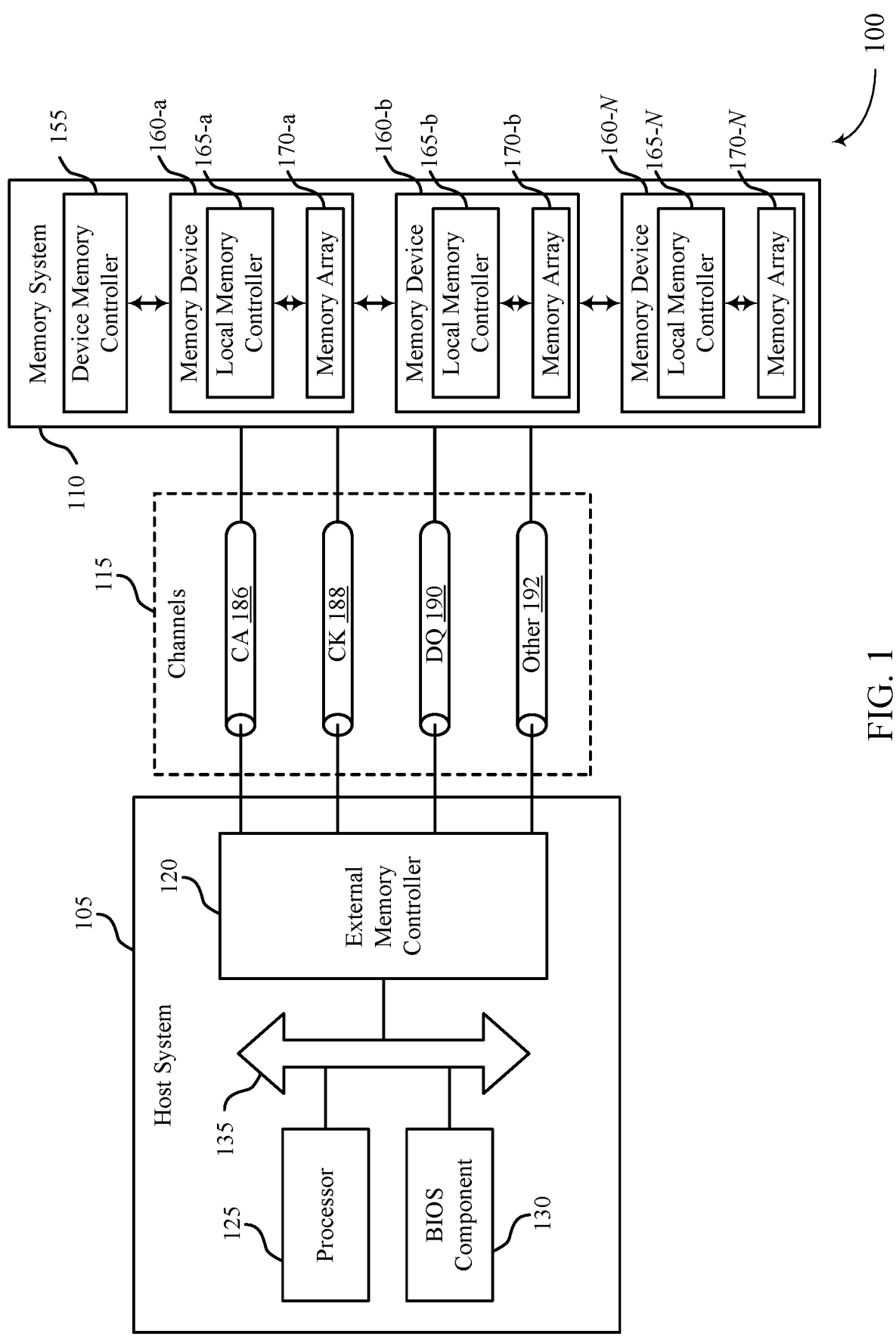
FIG. 1 illustrates an example of a system that supports a self-refresh state with decreased power consumption in accordance with examples as disclosed herein.

A memory system may perform refresh operations on one or more rows of memory cells at the memory system, which may improve a reliability of data stored by the corresponding rows of memory cells. To perform a refresh operation, a memory system may execute a read operation on a row of memory cells to detect data stored by that row and subsequently perform a write operation on the same row of memory cells to rewrite the data to the row of memory cells. In some cases, the memory system may execute refresh operations in response to receiving one or more refresh commands from a host system. Additionally, or alternatively, the memory system may execute refresh operations based on internally-generated refresh commands. For example, the memory system may enter a self-refresh state and execute refresh operations (e.g., in response to internally-generated refresh commands) on the rows of memory cells according to a refresh rate.

In some cases, a power consumption of the memory system operating in the self-refresh state may be based on the refresh rate. For example, the memory system may consume more power executing refresh operations according to a higher rate as compared to executing refresh operations according to a lower rate. In some cases, however, decreasing a rate associated with executing refresh operations may result in a decreased reliability of data stored in the rows of memory cells in the memory system. That is, upon entering the self-refresh state, a reliability of data stored in each row of memory cells may decrease as an amount of time between entering the self-refresh state and refreshing the corresponding row of memory cells increases. Thus, in cases that the memory system enters the self-refresh state and executes refresh operations according to a relatively slow refresh rate, some rows of memory cells at the memory system may not be refreshed for a correspondingly large amount of time. Here, a reliability of data stored in those rows of memory cells may decrease.

Accordingly, the techniques as described herein provide for decreasing a power consumption associated with executing refresh operations in a self-refresh state while maintaining a reliability associated with the self-refresh state. Specifically, the memory system may enter a self-refresh state and begin executing refresh operations according to a first refresh rate (e.g., a relatively fast refresh rate). Once the memory system determines that each row of memory cells at the memory system is refreshed according to the first refresh rate, the memory system may decrease the refresh rate to a second, slower, refresh rate. Thus, the memory system may refresh each row of memory cells at the memory system according to a relatively fast refresh rate, which may preserve a reliability of data stored in the rows of memory cells. Additionally, the memory system may decrease a rate of executing refresh operations in the self-refresh state, which may decrease a power consumption of the memory system while in the self-refresh state (e.g., as compared to a memory system executing refresh operations in the self-refresh state according to a higher rate).

Features of the disclosure are initially described in the context of systems and devices as described with reference to FIGS. 1 through 3. Features of the disclosure are described in the context of a timing diagram as described with reference to FIG. 4. These and other features of the disclosure are further illustrated by and described with reference to an apparatus diagram and flowchart that relate to self-refresh state with decreased power consumption as described with reference to FIGS. 5 and 6.

FIG. 1 illustrates an example of a system 100 that supports a self-refresh state with decreased power consumption in accordance with examples as disclosed herein. The system 100 may include a host system 105, a memory system 110, and a plurality of channels 115 coupling the host system 105 with the memory system 110. The system 100 may include one or more memory systems 110, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. The memory system 110 may be a component of the system 100 that is operable to store data for one or more other components of the system 100. In some cases, the memory system 110 may be referred to as a memory device.

Portions of the system 100 may be examples of the host system 105. The host system 105 may be an example of a processor (e.g., circuitry, processing circuitry, a processing component) within a device that uses memory to execute processes. In some examples, the host system 105 may refer to the hardware, firmware, software, or any combination thereof that implements the functions of an external memory controller 120.

A memory system 110 may be an independent device or a component that is operable to provide physical memory addresses space that may be used or referenced by the system 100. In some examples, a memory system 110 may be configurable to work with one or more different types of host systems. The memory system 110 may be operable to store data for the components of the host system 105. In some examples, the memory system 110 (e.g., operating as a secondary-type device to the host system 105, operating as a dependent-type device to the host system 105) may respond to and execute commands provided by the host system 105 through the external memory controller 120.

The host system 105 may include one or more of an external memory controller 120, a processor 125, a basic input/output system (BIOS) component 130, or other components such as one or more peripheral components or one or more input/output controllers. The components of the host system 105 may be coupled with one another using a bus 135. The processor 125 may be operable to provide functionality (e.g., control functionality) for the system 100 or the host system 105. The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105.

The memory system 110 may include a device memory controller 155 and one or more memory devices 160 (e.g., memory chips, memory dies) to support a capacity (e.g., a desired capacity, a specified capacity) for data storage. Each memory device 160 (e.g., memory device 160-a, memory device 160-b, memory device 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections, one or more rows) of memory cells, with each memory cell being operable to store one or more bits of data. A memory system 110 including two or more memory devices 160 may be referred to as a multi-die memory or a multi-die package or a multi-chip memory or a multi-chip package.

The device memory controller 155 may include components (e.g., circuitry, logic) operable to control operation of the memory system 110. The device memory controller 155 may include hardware, firmware, or instructions that enable the memory system 110 to perform various operations and may be operable to receive, transmit, or execute commands, data, or control information related to the components of the memory system 110. The device memory controller 155 may be operable to communicate with one or more of the external memory controller 120, the one or more memory devices 160, or the processor 125. In some examples, the device memory controller 155 may control operation of the memory system 110 described herein in conjunction with the local memory controller 165 of the memory device 160.

In some examples, the memory system 110 may communicate information (e.g., data, commands, or both) with the host system 105. For example, the memory system 110 may receive a write command indicating that the memory system 110 is to store data received from the host system 105, or receive a read command indicating that the memory system 110 is to provide data stored in a memory device 160 to the host system 105, among other types of information communication. For example, the memory system 110 may receive a refresh command from the host system 105 indicating that the memory system 110 is to execute a refresh operation at the memory devices 160.

A local memory controller 165 (e.g., local to a memory device 160) may include components (e.g., circuitry, logic) operable to control operation of the memory device 160. In some examples, a local memory controller 165 may be operable to communicate (e.g., receive or transmit data or commands or both) with the device memory controller 155. In some examples, a memory system 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof.

The external memory controller 120 may be operable to enable communication of information (e.g., data, commands, or both) between components of the system 100 (e.g., between components of the host system 105, such as the processor 125, and the memory system 110). The external memory controller 120 may process (e.g., convert, translate) communications exchanged between the components of the host system 105 and the memory system 110. In some examples, the external memory controller 120, or other component of the system 100 or the host system 105, or its functions described herein, may be implemented by the processor 125. Although the external memory controller 120 is depicted as being external to the memory system 110, in some examples, the external memory controller 120, or its functions described herein, may be implemented by one or more components of a memory system 110 (e.g., a device memory controller 155, a local memory controller 165) or vice versa.

The components of the host system 105 may exchange information with the memory system 110 using one or more channels 115. Each channel 115 may include one or more signal paths (e.g., a transmission medium, a conductor) between terminals associated with the components of the system 100. Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory system 110 may perform refresh operations at the memory arrays 170 of the memory system 110. To perform a refresh operation, the memory system 110 (e.g., the device memory controller 155, a local memory controller 165) may execute a read operation on a row of memory cells at a memory array 170 to detect data stored by that row. Additionally, the memory system 110 may then perform a write operation on the same row of memory cells at the memory array 170 to rewrite the data to the row of memory cells. In some cases, the memory system 110 may execute refresh operations in response to receiving one or more refresh commands from the host system 105 (e.g., via the CA channel 186). Additionally, or alternatively, the memory system 110 may execute refresh operations based commands generated by a controller of the memory system (e.g., the device memory controller 155, a local memory controller 165). For example, the memory system 110 may enter a self-refresh state and execute refresh operations (e.g., in response to internally-generated refresh commands) on the rows of memory cells in one or more memory arrays 170 according to a refresh rate. Additionally, or alternatively, the memory system 110 may cause one or more memory devices 160 to enter into a self-refresh state. Here, each memory device 160 in the self-refresh state may execute refresh operations on the rows of memory cells in a memory array 170 at the memory device 160.

In some cases, a power consumption of the memory system 110 operating in the self-refresh state may be based on the refresh rate. For example, the memory system 110 may consume more power executing refresh operations according to a higher rate as compared to executing refresh operations according to a lower rate. In some cases, however, decreasing a rate associated with executing refresh operations may result in a decreased reliability of data stored in the rows of memory cells in the memory system 110 (e.g., an increase in one or more errors in the data). That is, upon entering the self-refresh state, a reliability of data stored in each row of memory cells may decrease as an amount of time between entering the self-refresh state and refreshing the corresponding row of memory cells increases. Thus, in cases that the memory system 110 enters the self-refresh state and executes refresh operations according to a relatively slow refresh rate, some rows of memory cells at the memory system may not be refreshed for a correspondingly large amount of time. Here, a reliability of data stored in those rows of memory cells may decrease.

Accordingly, the techniques as described herein provide for decreasing a power consumption associated with executing refresh operations in a self-refresh state while maintaining a reliability associated with the self-refresh state. Specifically, the memory system 110 may enter a self-refresh state and begin executing refresh operations (e.g., at a row of a memory array 170) according to a first refresh rate (e.g., a relatively fast refresh rate). Once the memory system 110 determines that each row of memory cells at the memory system 110 (or, in some cases, that each row of memory cells at one or more memory arrays 170) is refreshed according to the first refresh rate, the memory system 110 may decrease the refresh rate to a second, slower, refresh rate. Thus, the memory system 110 may refresh each row of memory cells at the memory system 110 according to a relatively fast refresh rate, which may preserve a reliability of data stored in the rows of memory cells. Additionally, the memory system 110 may decrease a rate of executing refresh operations in the self-refresh state, which may decrease a power consumption of the memory system 110 while in the self-refresh state (e.g., as compared to a memory system 110 executing refresh operations in the self-refresh state according to a higher rate).

Figure 2:
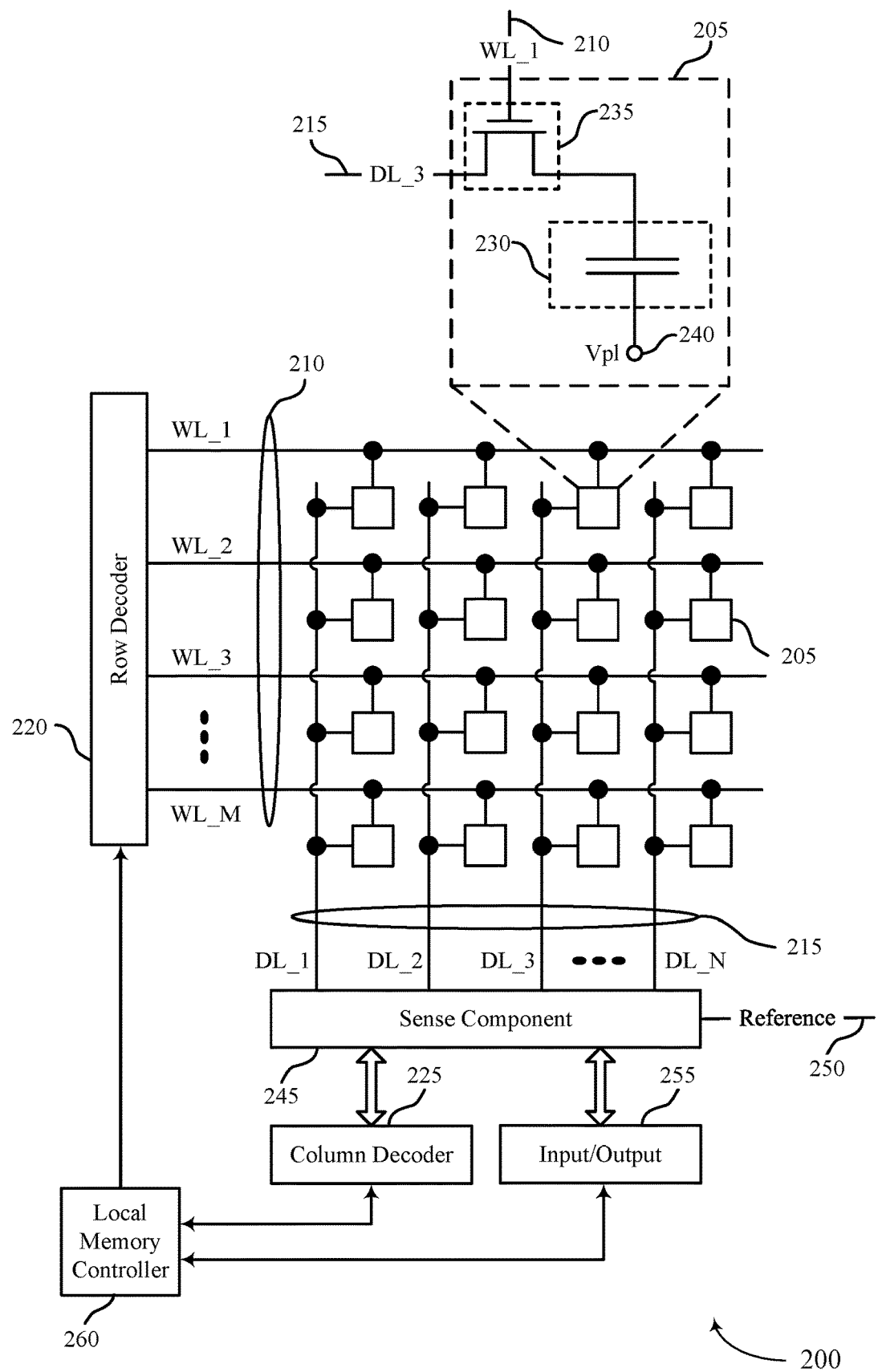
FIG. 2 illustrates an example of a memory device that supports a self-refresh state with decreased power consumption in accordance with examples as disclosed herein.

FIG. 2 illustrates an example of a memory device 200 that supports a self-refresh state with decreased power consumption in accordance with examples as disclosed herein. The memory device 200 may be an example of the memory devices 160 described with reference to FIG. 1. In some examples, the memory device 200 may be referred to as a memory chip, a memory die, or an electronic memory apparatus. The memory device 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory device 200 may include access lines (e.g., word lines 210, digit lines 215) arranged in a pattern, such as a grid-like pattern. An access line may be a conductive line coupled with a memory cell 205 and may be used to perform access operations on the memory cell 205. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The detected logic state of the memory cell 205 may be provided as an output of the sense component 245 (e.g., to an input/output 255), and may indicate the detected logic state to another component of a memory device (e.g., a memory system 110) that includes the memory device 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host system 105, another controller associated with the memory device 200), translate the commands or the data (or both) into information that can be used by the memory device 200, perform one or more operations on the memory device 200, and communicate data from the memory device 200 to a host (e.g., a host system 105) based on performing the one or more operations.

The local memory controller 260 may generate row signals and column address signals to activate the target word line 210 and the target digit line 215. The local memory controller 260 also may generate and control various signals (e.g., voltages, currents) used during the operation of the memory device 200. The local memory controller 260 may be operable to perform one or more access operations on one or more memory cells 205 of the memory device 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host system 105). The local memory controller 260 may be operable to perform other access operations not listed here or other operations related to the operating of the memory device 200 that are not directly related to accessing the memory cells 205.

The local memory controller 260 may be operable to perform a write operation (e.g., a programming operation) on one or more memory cells 205 of the memory device 200. During a write operation, a memory cell 205 of the memory device 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory device 200. During a read operation, the state (e.g., logic state, charge state) stored in a memory cell 205 of the memory device 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

The local memory controller 260 may be operable to perform a refresh operation on one or more memory cells 205 of the memory device 200. During a refresh operation, the state (e.g., logic state, charge state) stored in a row of memory cells 205 of the memory device 200 may be evaluated. The local memory controller 260 may identify a target row (e.g., a target word line 210) based on a value of a counter (e.g., that is included in the local memory controller 260, that is coupled with the local memory controller 260) indicating the target row. Additionally, or alternatively, the local memory controller 260 may identify the target row based on receiving a command from another controller (e.g., a device memory controller as described with reference to FIG. 1). In either example, the local memory controller 260 may activate the target word line 210 to access the memory cells 205 corresponding to the target word line 210, the memory cells 205 may transfer signals to the sense component 245, and the sense component 245 may determine the logic states stored on the memory cells 205 corresponding to the target word line 210. Then, the local memory controller 260 may perform a write operation on the target word line 210 to write the data (e.g., the logic states stored on the memory cells 205 corresponding to the target word line 210 determined by the sense component 245 during the read operation) to the target word line 210. The local memory controller 260 may then activate the target word line 210 and apply signals to the digit lines 215 to store the data in the capacitors 230 of the memory cells 205 corresponding to the target word line 210. In some instances (e.g., in instances that the local memory controller 260 identifies the target word line 210 for the refresh operation based on a value of the counter), the local memory controller 260 may increment the value of the counter based on executing the refresh operation on the target word line 210.

In some cases, the memory device 200 may execute refresh operations on the word lines 210 while in a self-refresh state. Specifically, the memory device 200 may enter a self-refresh state and begin executing refresh operations at each row of memory cells 205 (e.g., corresponding to a word line 210) of the memory device 200 according to a first refresh rate (e.g., a relatively fast refresh rate). Once the local memory controller 260 determines that each row of memory cells 205 at the memory device 200 is refreshed according to the first refresh rate, the local memory controller 260 may decrease the refresh rate to a second, slower, refresh rate. Thus, the local memory controller 260 may refresh each row of memory cells 205 according to a relatively fast refresh rate, which may preserve a reliability of data stored in the rows of memory cells 205. Additionally, the local memory controller 260 may decrease a rate of executing refresh operations in the self-refresh state, which may decrease a power consumption of the memory device 200 while in the self-refresh state (e.g., as compared to a memory device 200 executing refresh operations in the self-refresh state according to a higher rate).

Figure 3:
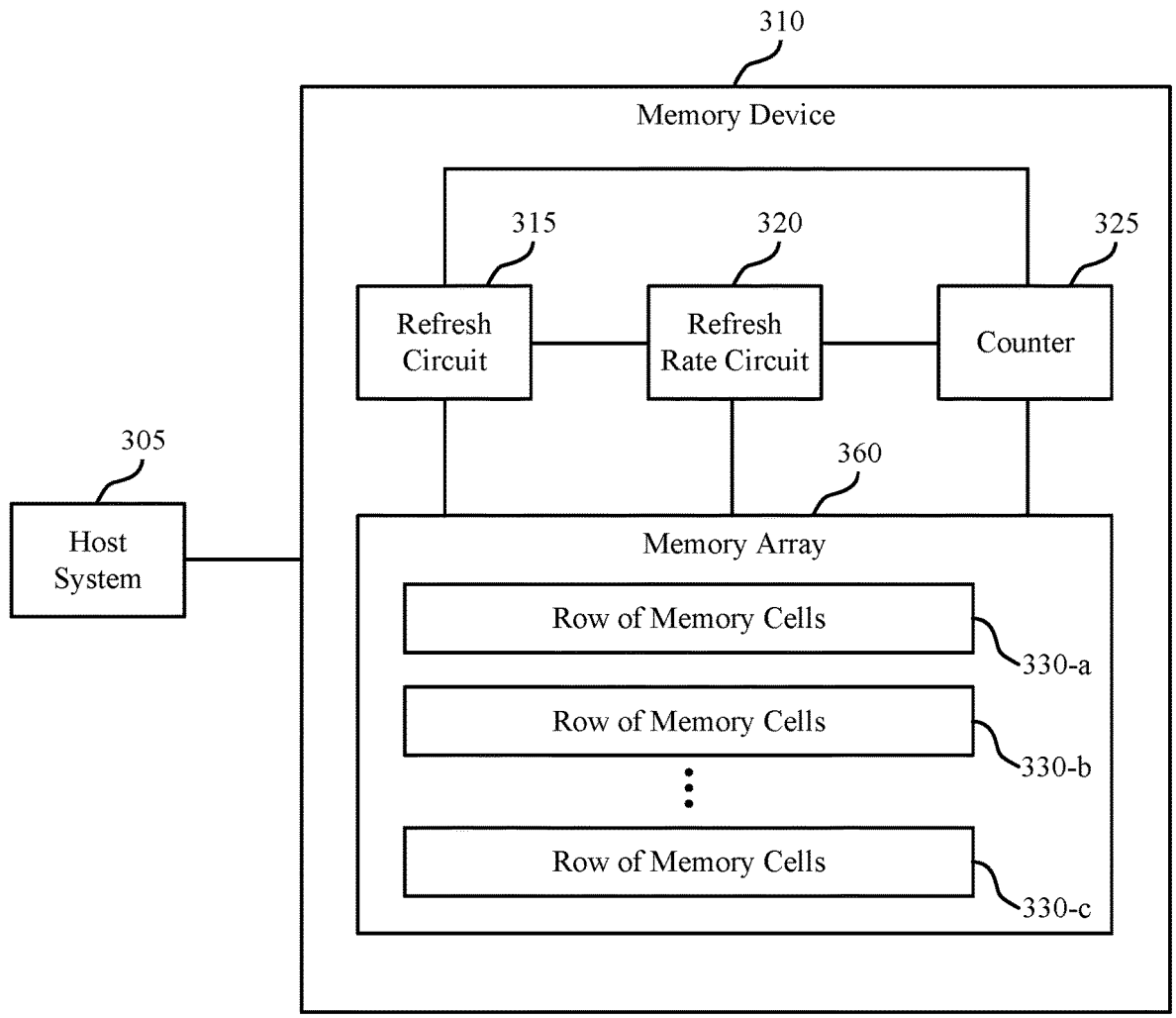
FIG. 3 illustrates an example of a system that supports a self-refresh state with decreased power consumption in accordance with examples as disclosed herein.

FIG. 3 illustrates an example of a system 300 that supports a self-refresh state with decreased power consumption in accordance with examples as disclosed herein. The system 300 may include aspects of the system and memory device as described with reference to FIGS. 1 and 2. For example, the host system 305 may be an example of the host system as described with reference to FIGS. 1 and 2. Additionally, the memory device 310 may be an example of a memory system or memory device as described with reference to FIGS. 1 and 2. Further, the memory array 360 may be an example of a memory device, memory die, or memory array as described with reference to FIGS. 1 and 2. The memory device 310 may additionally include a refresh circuit 315, a refresh rate circuit 320, and a counter 325. In some cases, one or more of the refresh circuit 315, the refresh rate circuit 320, and the counter 325 may be implemented by a controller (e.g., a device memory controller, a local memory controller) as described with reference to FIGS. 1 and 2. Additionally, or alternatively one or more of the refresh circuit 315, the refresh rate circuit 320, and the counter 325 may be implemented by circuitry that is distinct from a controller.

The memory device 310 may include one or more memory arrays 360 (e.g., a memory array, a memory die). The memory device may include a set of rows of memory cells 330, where each row of memory cells 330 is configured to store a set of data at the memory array 360. In some cases, the memory device 310 (e.g., via the refresh circuit 315) may execute a refresh operation on a row of memory cells 330. For example, the refresh circuit 315 may initiate a read operation at the row of memory cells 330 (e.g., to determine a set of data stored by the row of memory cells 330). Then, the refresh circuit 315 may initiate a write operation at the row of memory cells 33 (e.g., to store the set of data determined during the read operation at the row of memory cells).

In some instances, the refresh circuit 315 may execute refresh operations on the rows of memory cells 330 in response to a command received from the host system 305. That is, the host system 305 may transmit one or more commands indicating for the memory device 310 to execute one or more refresh operations. In some examples, the memory device 310 executing refresh operations in response to commands from the host system 305 may correspond to the memory device 310 operating in an automatic refresh state. Here, the automatic refresh state of the memory device 310 may correspond to a refresh rate (e.g., a preconfigured refresh rate, a predefined refresh rate, a refresh rate indicated by the host system 305).

In addition to executing refresh operations in response to receiving a command from the host system 305, the memory device 310 may execute refresh operations in response to internally-generated refresh commands. For example, the memory device 310 may enter a self-refresh state where the memory device 310 generates refresh commands and executes refresh operations without receiving commands from the host system 305. In some cases, the memory device 310 may enter the self-refresh state in response to receiving a command from the host system 305. Additionally, or alternatively, the memory device 310 may enter the self-refresh state based on an internally-generated command to enter the self-refresh state (e.g., from an automatic refresh state). In the self-refresh state, the refresh circuit 315 may generate a refresh command to execute a refresh operation on one of the rows of memory cells 330.

The refresh circuit 315 may execute refresh operations on rows of memory cells 330 at the memory device 310 based on values of the counter 325. For example, the refresh circuit 315 may detect the value of the counter 325 and identify one of the rows of memory cells 330 indicated by the value of the counter 325. Then, the refresh circuit 315 may execute a refresh operation at the indicated row of memory cells 330, increment the counter 325, and execute a next refresh operation on a next row of memory cells 330 (e.g., based on the incremented value of the counter 325 indicating the next row of memory cells 330). For example, in a case that a first value of the counter 325 indicates the row of memory cells 330-a, the refresh circuit 315 may execute a refresh operation on the row of memory cells 330-a, increment the counter 325 (e.g., output signaling to the counter 325 indicating that a refresh operation occurred at the memory device 310 which may cause the counter 325 to increment the value of the counter 325), and execute another refresh operation on the row of memory cells 330-b indicated by the incremented value of the counter 325. In cases that the value of the counter 325 indicates a last row of memory cells 330-c storing data at the memory device 310 (e.g., a row of memory cells 330-a associated with a larger value than other rows of memory cells 330 at the memory device 310), the counter 325 may roll over or reset a value of the counter 325. Thus, the value of the counter 325 may indicate a first row of memory cells 330-a at the memory device 310 (e.g., a row of memory cells 330-a associated with a smaller value than other rows of memory cells 330 at the memory device 310).

The refresh circuit 315 may initiate refresh operations on the rows of memory cells 330 (e.g., by generated refresh commands and executing the commands on a corresponding row of memory cells 330) according to a refresh rate. In some cases, the refresh rate may correspond to a periodicity, rate, time period, or frequency for executing a refresh operation on one of the rows of memory cells 330. Additionally, or alternatively, the rate may indicate a periodicity, rate, time period, or frequency for refreshing each of the rows of memory cells 330 at the memory device 310. The refresh rate for executing refresh operations during the self-refresh state may be indicated to the refresh circuit 315 by the refresh rate circuit 320. For example, the refresh rate circuit 320 may communicate signaling, to the refresh circuit 315, indicating the refresh rate for executing refresh operations during the self-refresh state.

In some cases, the refresh rate circuit 320 may indicate, to the refresh circuit 315, one of two or more possible refresh rates for executing refresh operations in the self-refresh state. For example, the refresh rate circuit 320 may output a signal corresponding to a low voltage state indicating the first refresh rate and may output a signal corresponding to a high voltage state indicating the second refresh rate. Here, the two possible refresh rates may be preconfigured or predefined (e.g., during a manufacturing of the memory device 310 or by the host system 305). Additionally, or alternatively, the refresh rate circuit 320 may indicate, to the refresh circuit 315, a refresh rate from more than two possible refresh rates for executing refresh operations in the self-refresh state. For example, the memory device 310 may be configured with a set of possible refresh rates (e.g., during a manufacturing of the memory device 310, by the host system 305). Then, the refresh rate circuit 320 may indicate one of the set of possible refresh rates to the refresh circuit 315 for executing refresh operations.

When the memory device 310 enters the self-refresh state, the memory device 310 may initially execute refresh operations according to a first, higher rate. For example, the refresh circuit 315 may execute a first set of refresh operations on the rows of memory cells 330 according to the first, higher rate. In this example, the refresh rate circuit 320 may output signaling to the refresh circuit 315 indicating for the refresh circuit 315 to execute refresh operations on the rows of memory cells 330 according to the first, higher rate. In some cases, the first, higher rate of executing refresh operations during the self-refresh state may be a same rate of executing refresh operations in response to refresh commands received from the host system (e.g., when the memory device 310 is in an automatic refresh state). For example, the memory device 310 may execute the first set of refresh operations to refresh each of the rows of memory cells 330 at the memory device 310 within 64 milliseconds (ms).

In some cases, the memory device 310 may decrease the rate of executing refresh operations while in the self-refresh state after executing a refresh operation on each of the rows of memory cells 330 at the memory device 310. For example, the refresh rate circuit 320 may determine whether each of the rows of memory cells 330 have been refreshed according to the first, higher refresh rate. In cases that each of the rows of memory cells 330 have not been refreshed according to the first, higher refresh rate since the memory device 310 entered the self-refresh state, the refresh rate circuit 320 may output signaling to the refresh circuit 315 indicating for the refresh circuit 315 to execute the refresh operations on the rows of memory cells 330 according to the first, higher refresh rate. Additionally, in cases that each of the rows of memory cells 330 have been refreshed according to the first, higher refresh rate since the memory device 310 entered the self-refresh state, the refresh rate circuit 320 may output signaling to the refresh circuit 315 indicating for the refresh circuit 315 to execute the refresh operations on the rows of memory cells 330 according to a second, slower refresh rate.

In some cases, when executing refresh operations in the self-refresh state according to the second, slower refresh rate, the memory device 310 may execute a second set of refresh operations to refresh each of the rows of memory cells 330 at the memory device 310 within a larger time interval (e.g., 5 ms, 2 seconds). Additionally, or alternatively, the refresh rate circuit 320 may select the second, slower refresh rate based on a temperature of the memory device 310. For example, in cases that a temperature of the memory device 310 is relatively low, the refresh rate circuit 320 may select a relatively slow second refresh rate (e.g., refreshing each of the rows of memory cells 330 within 2 seconds). In another example, in cases that a temperature of the memory device 310 is relatively high, the refresh rate circuit 320 may select a relatively fast second refresh rate (e.g., refreshing each of the rows of memory cells 330 within 5 ms).

The refresh rate circuit 320 may include circuitry configured to determine whether each of the rows of memory cells 330 have been refreshed according to the first, higher refresh rate since the memory device 310 entered the self-refresh state. In one example, the refresh rate circuit 320 may determine whether each of the rows of memory cells 330 have been refreshed based on comparing a value of the counter 325 when the memory device 310 initially entered the self-refresh state and a value of the counter 325 after executing each of the refresh operations while in the self-refresh state. Here, the refresh rate circuit 320 may determine that each of the rows of memory cells 330 have been refreshed when the value of the counter 325 when the memory device 310 initially entered the self-refresh state and the value of the counter 325 after executing a set of refresh operations are the same. That is, the value of the counter 325 may be the same as an initial value of the counter 325 when the counter 325 indicates for a row of memory cells 330 to be refreshed for a second time after entering the self-refresh mode.

In another example, the refresh rate circuit 320 may determine whether each of the rows of memory cells 330 have been refreshed based on initiating a counter at the refresh rate circuit 320 upon entering the self-refresh state. Here, the refresh rate circuit 320 may include a counter and when the memory device 310 enters the self-refresh state, the refresh rate circuit 320 may reset the counter (e.g., initialize the value of the counter to '0') at the refresh rate circuit 320. Then, the refresh rate circuit 320 may increment the value of the counter at the refresh rate circuit 320 in response to the refresh circuit 315 executing each of the refresh operations while in the self-refresh state. The refresh rate circuit 320 may compare the value of the counter at the refresh rate circuit 320 to a threshold that is based at least in part on a quantity of rows of memory cells 330 at the memory device 310. For example, the threshold may be equal to or greater than the quantity of rows of memory cells 330 at the memory device 310. When the refresh rate circuit 320 determines that the counter at the refresh rate circuit 320 exceeds the threshold, the refresh rate circuit 320 may determine that each of the rows of memory cells 330 have been refreshed at least once while the memory device 310 is in the self-refresh state.

In response to receiving signaling from the refresh rate circuit 320 indicating to decrease the rate of executing refresh operations in the self-refresh state, the refresh circuit 315 may execute refresh operations on the rows of memory cells 330 according to the second, slower refresh rate. The refresh circuit 315 may continue executing refresh operations on the rows of memory cells 330 according to the second, slower refresh rate until the memory device 310 exits the self-refresh state. In some cases, the memory device 310 may exit the self-refresh state prior to the refresh rate circuit 320 indicating to decrease the rate of executing refresh operations. For example, the memory device 310 may exit the self-refresh state prior to the refresh rate circuit 320 determining that each of the rows of memory cells 330 have been refreshed according to the first, higher refresh rate. Here, the memory device 310 may exit the self-refresh state without the refresh circuit 315 switching from the first, faster refresh rate to the second, slower refresh rate.

Figure 4:
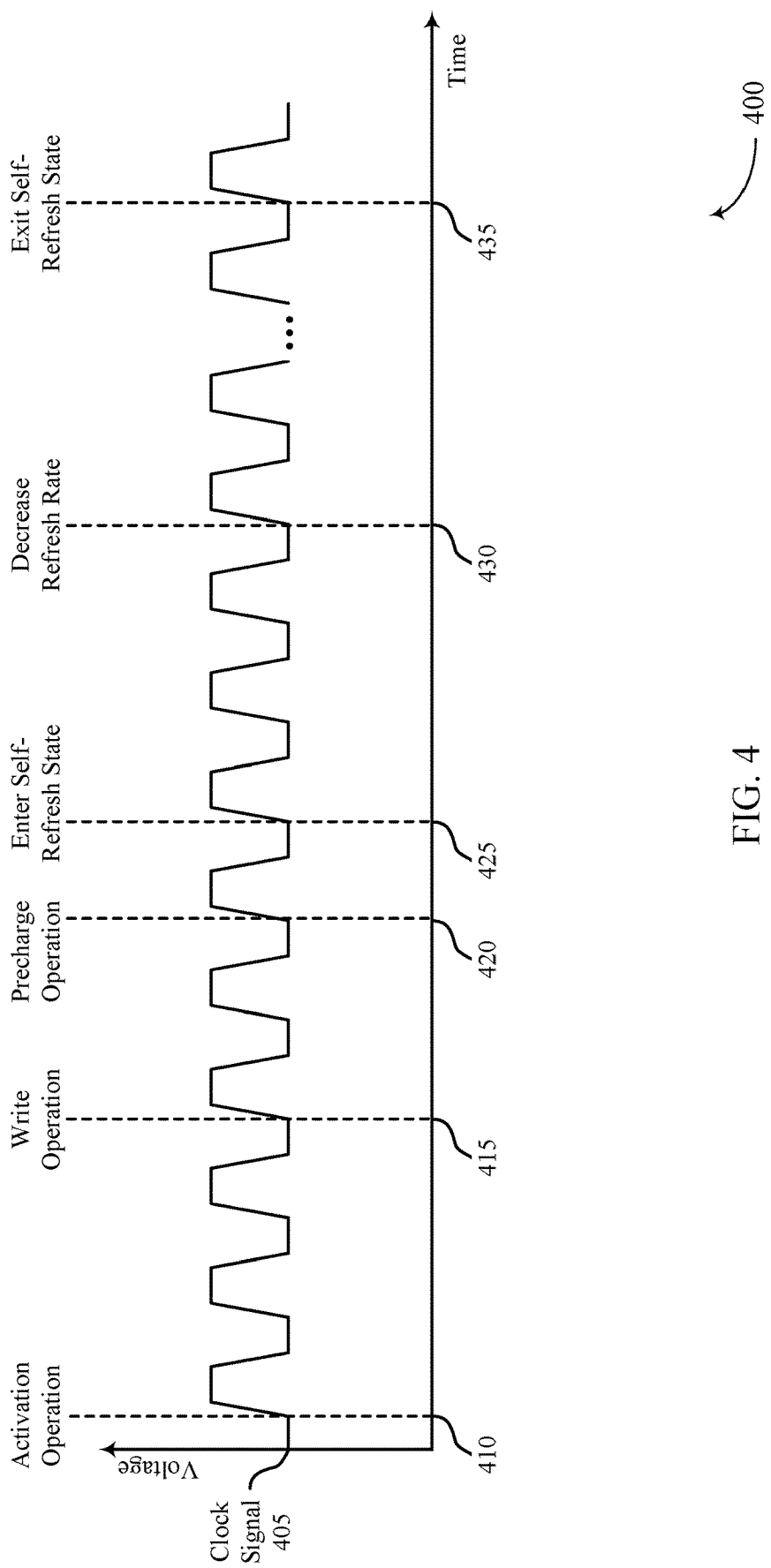
FIG. 4 illustrates an example of a timing diagram that supports a self-refresh state with decreased power consumption in accordance with examples as disclosed herein.

FIG. 4 illustrates an example of a timing diagram 400 that supports a self-refresh state with decreased power consumption in accordance with examples as disclosed herein. The timing diagram 400 may include aspects of the systems and memory devices as described with reference to FIGS. 1 through 3. For example, a memory device (or in some cases, a memory system or a memory die) may implement the timing diagram 400 when entering and exiting a self-refresh state. In the example of the timing diagram 400, the memory device may initially be in an automatic refresh state, may enter into a self-refresh state (e.g., at 425), and may exit the self-refresh state (e.g., at 435). The timing diagram 400 may illustrate an example set of operations performed by the memory device with respect to a clock signal 405 of the memory device or memory system.

At 410, the memory device may perform an activation operation to activate one or more rows of memory cells at the memory device. For example, the memory device may apply a voltage to one or more access lines of the memory device (e.g., to access the corresponding rows of memory cells at the memory device). At 415, the memory device may perform a write operation on the one or more rows of memory cells (e.g., activated at 410). In some cases, the memory device may perform the activate and write operations at 410 and 415, respectively, in response to a command received from a host system. Additionally, or alternatively, the memory device may perform the activate and write operations at 410 and 415, respectively, in response to an internally-generated command (e.g., by a controller at the memory device). At 420, the memory device may perform a precharge operation on the one or more rows of memory cells at the memory device. Here, the memory device may release data from a buffer (e.g., a write buffer) and deactivate the one or more rows of memory cells at the memory device (e.g., based on executing the write operation on the one or more rows of memory cells at the memory device at 410).

In some cases, a reliability of the data stored in the one or more rows of memory cells during an execution of the write operation at 415 may be based on a time between 415 (e.g., executing the write operation) and 420 (e.g., executing the precharge operation). In some cases, a longer duration between the write operation at 415 and the precharge operation at 420 may improve a reliability of data stored during the write operation at 415. Additionally, in cases that the time interval between 415 and 420 is shorter, the reliability of the data stored during the write operation at 415 may lessen. Here, executing a refresh operation on the one or more rows of memory cells (e.g., that were written to during the write operation at 415) may increase the reliability of those one or more rows of memory cells.

At 425, the memory device may enter the self-refresh state. For example, prior to 425 the memory device may execute refresh operations on rows of memory cells at the memory device in response to receiving commands (e.g., from a host system). At 425, the memory device may enter the self-refresh state and begin executing refresh operations in response to internally-generated commands. Additionally, or alternatively, the memory device may decrease a power supply to one or more components of the memory device upon entering the self-refresh state. Thus, entering the self-refresh state may correspond to a decrease in power consumption of the memory device as compared to a power consumption prior to entering the self-refresh state at 425.

The memory device may initially execute refresh operations according to a first, higher rate upon entering the self-refresh state at 425. In some cases, the memory device may execute the refresh operations at a same rate of executing refresh operations in response to refresh commands received from the host system (e.g., prior to the memory device entering the self-refresh state at 425). For example, the memory device may begin executing refresh operations at 425 to refresh each of the rows of memory cells at the memory device within 64 ms. In some cases, executing a refresh operation on each row of memory cells at the memory device may improve a reliability of data stored by the rows of memory cells. For example, one or more rows of memory cells may be associated with a decreased reliability prior to executing the refresh operation on the rows of memory cells (e.g., due to being written to at 415 in cases where a time interval between the write operation at 415 and the precharge operation at 420 is relatively short). Here, executing the refresh operations on those rows of memory cells may improve a reliability of the data stored by the rows of memory cells.

At 430, the memory device may decrease the refresh rate from the first, faster refresh rate to a second, slower refresh rate. That is, at 430 the memory device may decrease the rate of executing refresh operations while in the self-refresh state after executing refresh operations on each of the rows of memory cells at the memory device according to the first, faster refresh rate. For example, at 430 the memory device may determine that each of the rows of memory cells have been refreshed according to the first, higher refresh rate and decrease the refresh rate to the second, slower refresh rate in response to the determination. In some cases, executing refresh operations according to the first, higher refresh rate prior to decreasing a refresh rate may improve a reliability of the rows of memory cells at the memory device (e.g., as compared to entering the self-refresh state and initially executing refresh operations according to the second, slower refresh rate).

In the example of the timing diagram 400, the memory device determines that each of the rows of memory cells have been refreshed according to the first, higher refresh rate while in the self-refresh state. In some other examples, a memory device may not determine that each of the rows of memory cells have been refreshed according to the first, higher refresh rate prior to exiting the self-refresh state. Here, the memory device may not decrease the rate for executing refresh operations while in the self-refresh state (e.g., may refrain from decreasing the rate for executing the refresh operations based on determining that each of the rows of memory cells have not been refreshed according to the first, higher refresh rate) and may exit the self-refresh state prior to decreasing the refresh rate.

In some cases, when executing refresh operations in the self-refresh state according to the second, slower refresh rate (e.g., after 430), the memory device may execute refresh operations to refresh each of the rows of memory cells at the memory device within a larger time interval (e.g., as compared to a time interval associated with refreshing each of the rows of memory cells at the memory device according to the first, faster refresh rate).

At 435, the memory device may exit the self-refresh state (e.g., and enter an automatic refresh state). That is, at 435 the memory device may stop generating commands to refresh rows of memory cells at the memory device and may begin executing refresh operations in response to commands received from a host system.

Figure 5:
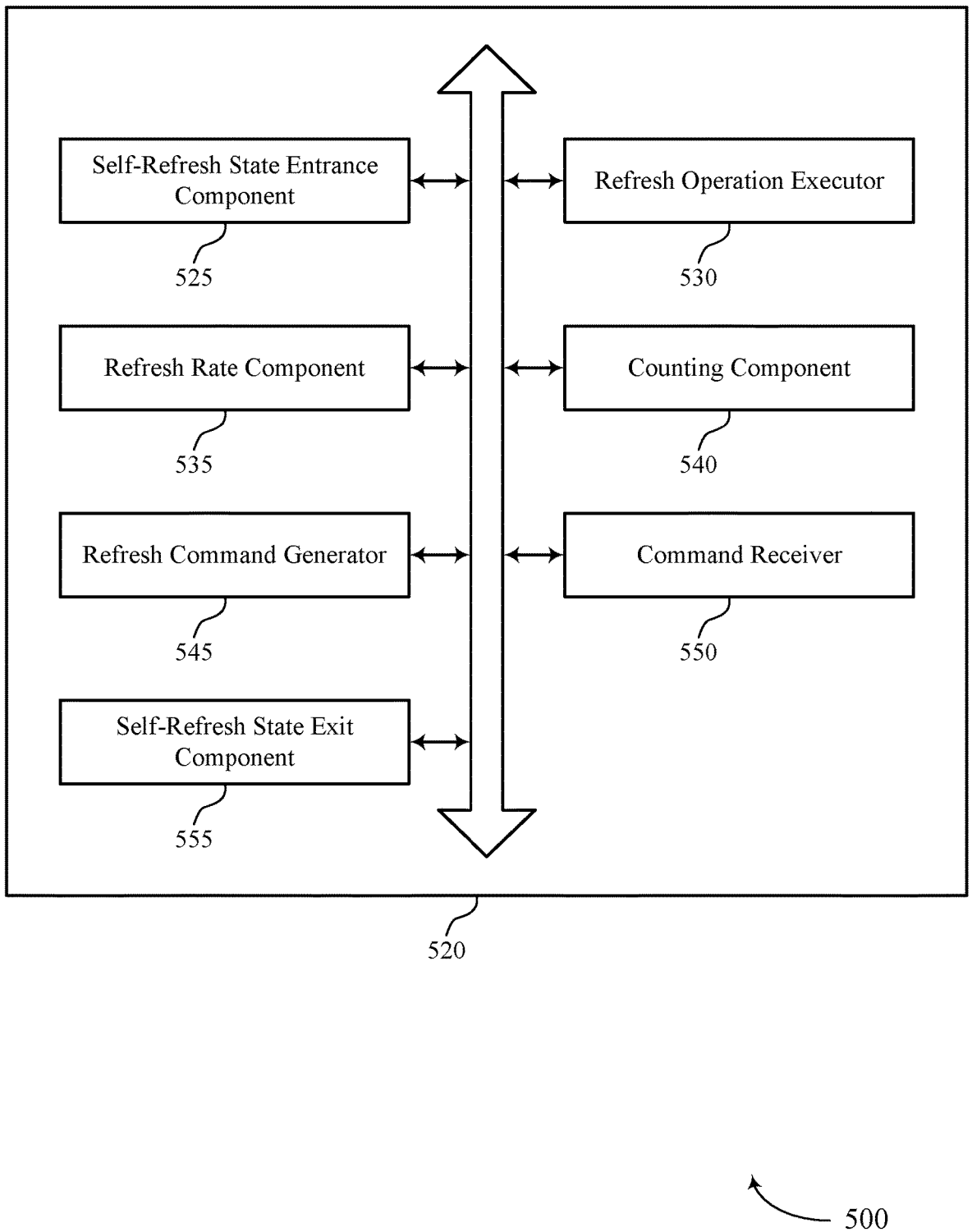
FIG. 5 shows a block diagram of a memory system that supports a self-refresh state with decreased power consumption in accordance with examples as disclosed herein.

FIG. 5 shows a block diagram 500 of a memory system 520 that supports a self-refresh state with decreased power consumption in accordance with examples as disclosed herein. The memory system 520 may be an example of aspects of a memory system or a memory device as described with reference to FIGS. 1 through 4. The memory system 520, or various components thereof, may be an example of means for performing various aspects of self-refresh state with decreased power consumption as described herein. For example, the memory system 520 may include a self-refresh state entrance component 525, a refresh operation executor 530, a refresh rate component 535, a counting component 540, a refresh command generator 545, a command receiver 550, a self-refresh state exit component 555, or any combination thereof. Each of these components may communicate, directly or indirectly, with one another (e.g., via one or more buses).

The self-refresh state entrance component 525 may be configured as or otherwise support a means for entering a self-refresh state to refresh a plurality of rows of memory cells at a memory system. The refresh operation executor 530 may be configured as or otherwise support a means for executing, based at least in part on entering the self-refresh state, a plurality of first refresh operations on the plurality of rows of memory cells according to a first rate for executing refresh operations. The refresh rate component 535 may be configured as or otherwise support a means for determining, while the memory system is in the self-refresh state, whether to decrease a rate for executing refresh operations in the self-refresh state from the first rate to a second rate based at least in part on whether each row of the plurality of rows of memory cells is refreshed according to the first rate. In some examples, the refresh operation executor 530 may be configured as or otherwise support a means for executing a plurality of second refresh operations on the plurality of rows of memory cells according to the second rate based at least in part on determining whether to decrease the rate.

In some examples, the counting component 540 may be configured as or otherwise support a means for incrementing a counter associated with performing refresh operations on the plurality of rows of memory cells based at least in part on executing each of the plurality of first refresh operations, where determining whether to decrease the rate for executing refresh operations in the self-refresh state is based at least in part on a value indicated by the counter.

In some examples, the refresh rate component 535 may be configured as or otherwise support a means for comparing, based at least in part on executing each of the plurality of first refresh operations, the value indicated by the counter to a threshold, where determining whether to decrease the rate is based at least in part on the value indicated by the counter.

In some examples, the refresh rate component 535 may be configured as or otherwise support a means for decreasing the rate for executing refresh operations in the self-refresh state from the first rate to the second rate based at least in part on the value of the counter exceeding the threshold, where executing the plurality of second refresh operations is based at least in part on decreasing the rate for executing the refresh operations in the self-refresh state.

In some examples, the threshold is based at least in part on an address indicating one of the plurality of rows of memory cells associated with an initial first refresh operation executed based at least in part on entering the self-refresh state.

In some examples, the refresh rate component 535 may be configured as or otherwise support a means for identifying the second rate from one of a plurality of rates for executing refresh operations in the self-refresh state that are slower than the first rate, where executing the plurality of second refresh operations is based at least in part on identifying the second rate.

In some examples, the refresh command generator 545 may be configured as or otherwise support a means for generating a plurality of refresh commands, where executing the plurality of first refresh operations and second refresh operations is based at least in part on generating the plurality of refresh commands.

In some examples, the command receiver 550 may be configured as or otherwise support a means for receiving, from a host system, a command to refresh the plurality of rows of memory cells at the memory system. In some examples, the refresh operation executor 530 may be configured as or otherwise support a means for executing a plurality of third refresh operations on the plurality of rows of memory cells according to the first rate based at least in part on receiving the command, where entering the self-refresh state at the memory system is based at least in part on executing the plurality of third refresh operations.

In some examples, to support executing one of the plurality of first refresh operations or second refresh operations, the refresh operation executor 530 may be configured as or otherwise support a means for reading one row from the plurality of rows of memory cells at the memory system to identify a set of data stored in the one row. In some examples, to support executing one of the plurality of first refresh operations or second refresh operations, the refresh operation executor 530 may be configured as or otherwise support a means for writing the set of data to the one row based at least in part on reading the one row.

In some examples, the self-refresh state exit component 555 may be configured as or otherwise support a means for exiting the self-refresh state at the memory system based at least in part on executing the plurality of second refresh operations.

In some examples, the self-refresh state entrance component 525 may be configured as or otherwise support a means for re-entering the self-refresh state to refresh the plurality of rows of memory cells at the memory system based at least in part on the exiting of the self-refresh state. In some examples, the refresh operation executor 530 may be configured as or otherwise support a means for executing, based at least in part on re-entering the self-refresh state, a plurality of third refresh operations on the plurality of rows of memory cells according to the first rate for executing refresh operations. In some examples, the refresh rate component 535 may be configured as or otherwise support a means for determining, while the memory system is in the self-refresh state, whether to decrease the rate for executing refresh operations in the self-refresh state from the first rate to the second rate based at least in part on whether each row of the plurality of rows of memory cells is refreshed according to the first rate. In some examples, the self-refresh state exit component 555 may be configured as or otherwise support a means for exiting the self-refresh state at the memory system based at least in part on determining to refrain from decreasing the rate for executing the refresh operations to the second rate.

Figure 6:
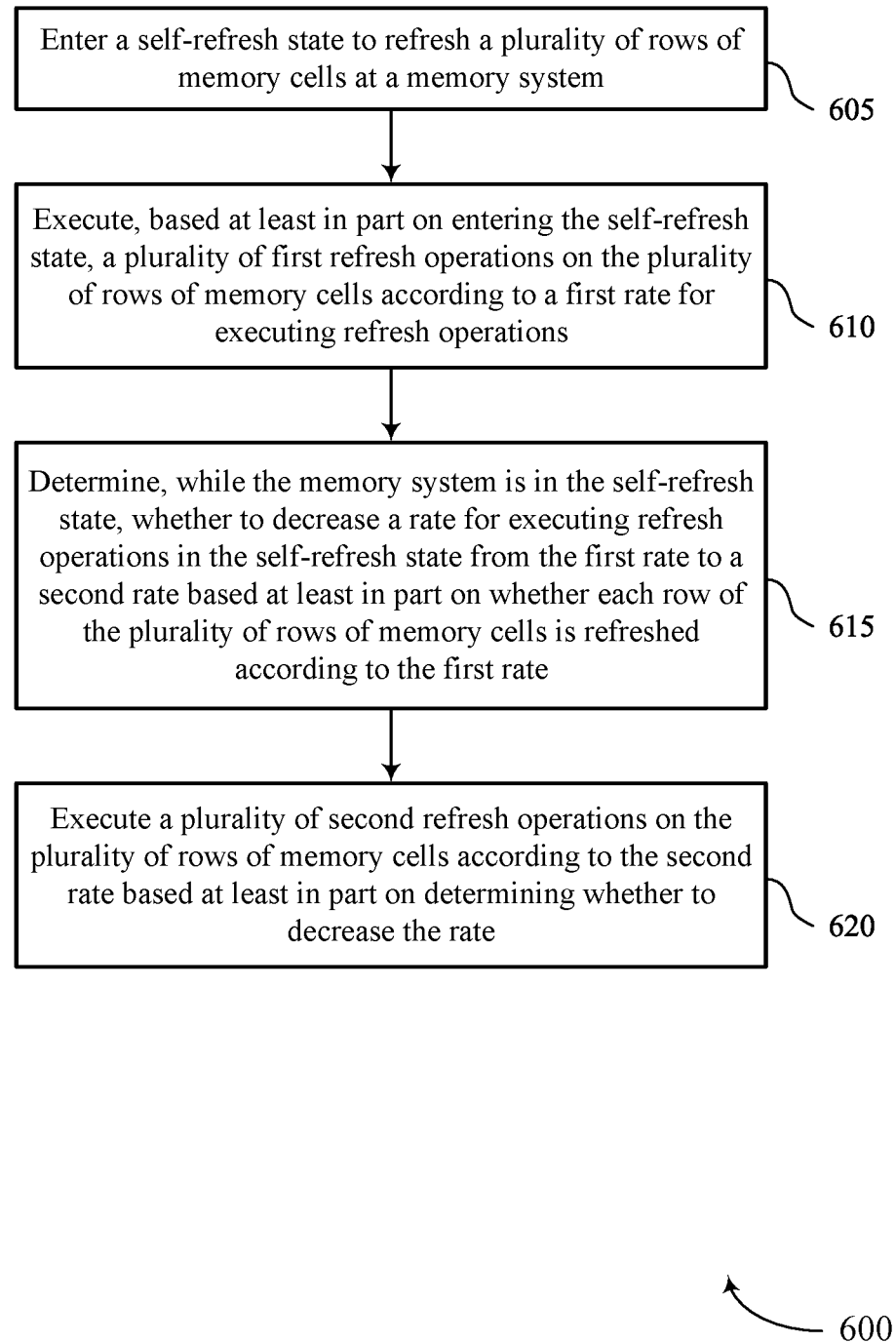
FIG. 6 shows a flowchart illustrating a method or methods that support self-refresh state with decreased power consumption in accordance with examples as disclosed herein.

FIG. 6 shows a flowchart illustrating a method 600 that supports a self-refresh state with decreased power consumption in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include entering a self-refresh state to refresh a plurality of rows of memory cells at a memory system. The operations of 605 may be performed in accordance with examples as disclosed herein. In some examples, aspects of the operations of 605 may be performed by a self-refresh state entrance component 525 as described with reference to FIG. 5.

At 610, the method may include executing, based at least in part on entering the self-refresh state, a plurality of first refresh operations on the plurality of rows of memory cells according to a first rate for executing refresh operations. The operations of 610 may be performed in accordance with examples as disclosed herein. In some examples, aspects of the operations of 610 may be performed by a refresh operation executor 530 as described with reference to FIG. 5.

At 615, the method may include determining, while the memory system is in the self-refresh state, whether to decrease a rate for executing refresh operations in the self-refresh state from the first rate to a second rate based at least in part on whether each row of the plurality of rows of memory cells is refreshed according to the first rate. For example, the method may include determining whether each row of the plurality of rows of memory cells is refreshed according to the first rate based on whether a counter (e.g., the counter 325) has counted through each row of the plurality of rows of memory cells since entering the self-refresh state. The operations of 615 may be performed in accordance with examples as disclosed herein. In some examples, aspects of the operations of 615 may be performed by a refresh rate component 535 as described with reference to FIG. 5.

At 620, the method may include executing a plurality of second refresh operations on the plurality of rows of memory cells according to the second rate based at least in part on determining whether to decrease the rate. The operations of 620 may be performed in accordance with examples as disclosed herein. In some examples, aspects of the operations of 620 may be performed by a refresh operation executor 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for entering a self-refresh state to refresh a plurality of rows of memory cells at a memory system; executing, based at least in part on entering the self-refresh state, a plurality of first refresh operations on the plurality of rows of memory cells according to a first rate for executing refresh operations; determining, while the memory system is in the self-refresh state, whether to decrease a rate for executing refresh operations in the self-refresh state from the first rate to a second rate based at least in part on whether each row of the plurality of rows of memory cells is refreshed according to the first rate; and executing a plurality of second refresh operations on the plurality of rows of memory cells according to the second rate based at least in part on determining whether to decrease the rate.

Aspect 2: The method, apparatus, or non-transitory computer-readable medium of aspect 1, further including operations, features, circuitry, logic, means, or instructions, or any combination thereof for incrementing a counter associated with performing refresh operations on the plurality of rows of memory cells based at least in part on executing each of the plurality of first refresh operations, where determining whether to decrease the rate for executing refresh operations in the self-refresh state is based at least in part on a value indicated by the counter.

Aspect 3: The method, apparatus, or non-transitory computer-readable medium of aspect 2, further including operations, features, circuitry, logic, means, or instructions, or any combination thereof for comparing, based at least in part on executing each of the plurality of first refresh operations, the value indicated by the counter to a threshold, where determining whether to decrease the rate is based at least in part on the value indicated by the counter.

Aspect 4: The method, apparatus, or non-transitory computer-readable medium of aspect 3, further including operations, features, circuitry, logic, means, or instructions, or any combination thereof for decreasing the rate for executing refresh operations in the self-refresh state from the first rate to the second rate based at least in part on the value of the counter exceeding the threshold, where executing the plurality of second refresh operations is based at least in part on decreasing the rate for executing the refresh operations in the self-refresh state.

Aspect 5: The method, apparatus, or non-transitory computer-readable medium of any of aspects 3 through 4 where the threshold is based at least in part on an address indicating one of the plurality of rows of memory cells associated with an initial first refresh operation executed based at least in part on entering the self-refresh state.

Aspect 6: The method, apparatus, or non-transitory computer-readable medium of any of aspects 1 through 5, further including operations, features, circuitry, logic, means, or instructions, or any combination thereof for identifying the second rate from one of a plurality of rates for executing refresh operations in the self-refresh state that are slower than the first rate, where executing the plurality of second refresh operations is based at least in part on identifying the second rate.

Aspect 7: The method, apparatus, or non-transitory computer-readable medium of any of aspects 1 through 6, further including operations, features, circuitry, logic, means, or instructions, or any combination thereof for generating a plurality of refresh commands, where executing the plurality of first refresh operations and second refresh operations is based at least in part on generating the plurality of refresh commands.

Aspect 8: The method, apparatus, or non-transitory computer-readable medium of any of aspects 1 through 7, further including operations, features, circuitry, logic, means, or instructions, or any combination thereof for receiving, from a host system, a command to refresh the plurality of rows of memory cells at the memory system and executing a plurality of third refresh operations on the plurality of rows of memory cells according to the first rate based at least in part on receiving the command, where entering the self-refresh state at the memory system is based at least in part on executing the plurality of third refresh operations.

Aspect 9: The method, apparatus, or non-transitory computer-readable medium of any of aspects 1 through 8 where executing one of the plurality of first refresh operations or second refresh operations includes operations, features, circuitry, logic, means, or instructions, or any combination thereof for reading one row from the plurality of rows of memory cells at the memory system to identify a set of data stored in the one row and writing the set of data to the one row based at least in part on reading the one row.

Aspect 10: The method, apparatus, or non-transitory computer-readable medium of any of aspects 1 through 9, further including operations, features, circuitry, logic, means, or instructions, or any combination thereof for exiting the self-refresh state at the memory system based at least in part on executing the plurality of second refresh operations.

Aspect 11: The method, apparatus, or non-transitory computer-readable medium of aspect 10, further including operations, features, circuitry, logic, means, or instructions, or any combination thereof for re-entering the self-refresh state to refresh the plurality of rows of memory cells at the memory system based at least in part on the exiting of the self-refresh state; executing, based at least in part on re-entering the self-refresh state, a plurality of third refresh operations on the plurality of rows of memory cells according to the first rate for executing refresh operations; determining, while the memory system is in the self-refresh state, whether to decrease the rate for executing refresh operations in the self-refresh state from the first rate to the second rate based at least in part on whether each row of the plurality of rows of memory cells is refreshed according to the first rate; and exiting the self-refresh state at the memory system based at least in part on determining to refrain from decreasing the rate for executing the refresh operations to the second rate.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a plurality of rows of memory cells;
    a refresh circuit coupled with the plurality of rows of memory cells and configured to:
        enter a self-refresh state to refresh the plurality of rows of memory cells; and
        execute, based at least in part on entering the self-refresh state, a plurality of first refresh operations on the plurality of rows of memory cells according to a first rate for executing refresh operations; and
    a refresh rate circuit coupled with the plurality of rows of memory cells and the refresh circuit, the refresh rate circuit configured to:
        determine, while the apparatus is in the self-refresh state, whether to decrease a rate for executing refresh operations in the self-refresh state from the first rate to a second rate based at least in part on whether each row of the plurality of rows of memory cells is refreshed according to the first rate,
        wherein the refresh circuit is further configured to execute a plurality of second refresh operations on the plurality of rows of memory cells according to the second rate based at least in part on determining whether to decrease the rate.

2. The apparatus of claim 1, further comprising:
    a counter coupled with the refresh circuit and the refresh rate circuit, wherein the refresh circuit is further configured to:
        increment the counter based at least in part on executing each of the plurality of first refresh operations, wherein determining whether to decrease the rate for executing refresh operations in the self-refresh state is based at least in part on a value indicated by the counter.

3. The apparatus of claim 2, wherein the refresh rate circuit is further configured to:
    compare, based at least in part on executing each of the plurality of first refresh operations, the value indicated by the counter to a threshold, wherein determining whether to decrease the rate is based at least in part on the value indicated by the counter.

4. The apparatus of claim 3, wherein the refresh rate circuit is further configured to:
    decrease the rate for executing refresh operations in the self-refresh state from the first rate to the second rate based at least in part on the value indicated by the counter exceeding the threshold, wherein executing the plurality of second refresh operations is based at least in part on decreasing the rate for executing the refresh operations in the self-refresh state.

5. The apparatus of claim 3, wherein the threshold is based at least in part on an address indicating one of the plurality of rows of memory cells associated with an initial first refresh operation executed based at least in part on entering the self-refresh state.

6. The apparatus of claim 1, wherein the refresh rate circuit is further configured to:
    identify the second rate from one of a plurality of rates for executing refresh operations in the self-refresh state that are slower than the first rate, wherein executing the plurality of second refresh operations is based at least in part on identifying the second rate.

7. The apparatus of claim 1, wherein the refresh circuit is further configured to:
    generate a plurality of refresh commands, wherein executing the plurality of first refresh operations and second refresh operations is based at least in part on generating the plurality of refresh commands.

8. The apparatus of claim 1, wherein the refresh circuit is further configured to:
receive, from a host system, a command to refresh the plurality of rows of memory cells; and
execute a plurality of third refresh operations on the plurality of rows of memory cells according to the first rate based at least in part on receiving the command, wherein entering the self-refresh state is based at least in part on executing the plurality of third refresh operations.

9. The apparatus of claim 1, wherein to execute one of the plurality of first refresh operations or second refresh operations, the refresh circuit is further configured to:
read one row from the plurality of rows of memory cells to identify a set of data stored in the one row; and
write the set of data to the one row based at least in part on reading the one row.

10. The apparatus of claim 1, wherein the refresh circuit is further configured to:
exit the self-refresh state based at least in part on executing the plurality of second refresh operations.

11. The apparatus of claim 10, wherein:
the refresh circuit is further configured to:
re-enter the self-refresh state to refresh the plurality of rows of memory cells based at least in part on the exiting of the self-refresh state; and
execute, based at least in part on re-entering the self-refresh state, a plurality of third refresh operations on the plurality of rows of memory cells according to the first rate for executing refresh operations;
the refresh rate circuit is further configured to determine, while the apparatus is in the self-refresh state, whether to decrease the rate for executing refresh operations in the self-refresh state from the first rate to the second rate based at least in part on whether each row of the plurality of rows of memory cells is refreshed according to the first rate; and
the refresh circuit is further configured to exit the self-refresh state based at least in part on determining to refrain from decreasing the rate for executing the refresh operations to the second rate.

12. A method, comprising:
entering a self-refresh state to refresh a plurality of rows of memory cells at a memory system;
executing, based at least in part on entering the self-refresh state, a plurality of first refresh operations on the plurality of rows of memory cells according to a first rate for executing refresh operations;
determining, while the memory system is in the self-refresh state, whether to decrease a rate for executing refresh operations in the self-refresh state from the first rate to a second rate based at least in part on whether each row of the plurality of rows of memory cells is refreshed according to the first rate; and
executing a plurality of second refresh operations on the plurality of rows of memory cells according to the second rate based at least in part on determining whether to decrease the rate.

13. The method of claim 12, further comprising:
incrementing a counter associated with performing refresh operations on the plurality of rows of memory cells based at least in part on executing each of the plurality of first refresh operations, wherein determining whether to decrease the rate for executing refresh operations in the self-refresh state is based at least in part on a value indicated by the counter.

14. The method of claim 13, further comprising:
comparing, based at least in part on executing each of the plurality of first refresh operations, the value indicated by the counter to a threshold, wherein determining whether to decrease the rate is based at least in part on the value indicated by the counter.

15. The method of claim 14, further comprising:
decreasing the rate for executing refresh operations in the self-refresh state from the first rate to the second rate based at least in part on the value indicated by the counter exceeding the threshold, wherein executing the plurality of second refresh operations is based at least in part on decreasing the rate for executing the refresh operations in the self-refresh state.

16. The method of claim 14, wherein the threshold is based at least in part on an address indicating one of the plurality of rows of memory cells associated with an initial first refresh operation executed based at least in part on entering the self-refresh state.

17. The method of claim 12, further comprising:
identifying the second rate from one of a plurality of rates for executing refresh operations in the self-refresh state that are slower than the first rate, wherein executing the plurality of second refresh operations is based at least in part on identifying the second rate.

18. The method of claim 12, further comprising:
generating a plurality of refresh commands, wherein executing the plurality of first refresh operations and second refresh operations is based at least in part on generating the plurality of refresh commands.

19. The method of claim 12, further comprising:
receiving, from a host system, a command to refresh the plurality of rows of memory cells at the memory system; and
executing a plurality of third refresh operations on the plurality of rows of memory cells according to the first rate based at least in part on receiving the command, wherein entering the self-refresh state at the memory system is based at least in part on executing the plurality of third refresh operations.

20. A non-transitory computer-readable medium storing code, the code comprising instructions executable by a processor to:
enter a self-refresh state to refresh a plurality of rows of memory cells at a memory system;
execute, based at least in part on entering the self-refresh state, a plurality of first refresh operations on the plurality of rows of memory cells according to a first rate for executing refresh operations;
determine, while the memory system is in the self-refresh state, whether to decrease a rate for executing refresh operations in the self-refresh state from the first rate to a second rate based at least in part on whether each row of the plurality of rows of memory cells is refreshed according to the first rate; and
execute a plurality of second refresh operations on the plurality of rows of memory cells according to the second rate based at least in part on determining whether to decrease the rate.

* * * * *